US008264232B2

(12) United States Patent
Rival

(10) Patent No.: US 8,264,232 B2
(45) Date of Patent: Sep. 11, 2012

(54) EVALUATION OF THE INTEGRITY OF DEPRESSED CONTACTS BY VARIATION OF THE ROTATION OF THE POLE-SHAFT

(75) Inventor: Marc Rival, Saint Ismier (FR)

(73) Assignee: Schneider Electric Industries SAS, Rueil-Malmaison (FR)

( * ) Notice: Subject to any disclaimer, the term of this patent is extended or adjusted under 35 U.S.C. 154(b) by 289 days.

(21) Appl. No.: 12/662,647

(22) Filed: Apr. 27, 2010

(65) Prior Publication Data

US 2010/0288606 A1 Nov. 18, 2010

(30) Foreign Application Priority Data

May 18, 2009 (FR) ..................................... 09 02433

(51) Int. Cl.
*G01R 31/327* (2006.01)
*G08B 21/00* (2006.01)

(52) U.S. Cl. ..... 324/421; 324/424; 340/638; 340/686.1; 340/686.3; 340/686.6; 200/308

(58) Field of Classification Search .................. 200/244, 200/308; 218/22, 23, 30, 31, 32; 324/71.1, 324/71.2, 415, 423, 424; 340/521, 593, 635, 340/638, 641, 643, 644, 650–652, 686.1, 340/686.3, 686.6, 687
See application file for complete search history.

(56) References Cited

U.S. PATENT DOCUMENTS

| | | | | |
|---|---|---|---|---|
| 4,713,508 | A | 12/1987 | Baginski et al. | 200/153 |
| 5,581,219 | A * | 12/1996 | Nozawa et al. | 335/132 |
| 5,731,560 | A | 3/1998 | Nebon et al. | 218/22 |
| 6,002,560 | A * | 12/1999 | Nguyen et al. | 361/23 |
| 6,018,284 | A | 1/2000 | Rival et al. | 335/16 |
| 6,150,625 | A * | 11/2000 | Marchand et al. | 218/118 |
| 6,225,807 | B1 | 5/2001 | Pohl | 324/423 |
| 6,466,023 | B2 * | 10/2002 | Dougherty et al. | 324/424 |
| 6,777,635 | B2 | 8/2004 | Baginski et al. | 200/401 |
| 7,045,731 | B2 * | 5/2006 | Schmidt et al. | 200/308 |
| 7,075,027 | B1 * | 7/2006 | Fogle et al. | 218/154 |
| 7,098,418 | B1 * | 8/2006 | Yamada et al. | 218/120 |
| 7,109,720 | B2 | 9/2006 | Baurand et al. | 324/421 |
| 2002/0056625 | A1 | 5/2002 | Becker et al. | 200/86.5 |
| 2004/0223276 | A1 * | 11/2004 | Wimmer | 361/93.6 |
| 2005/0122117 | A1 * | 6/2005 | Baurand et al. | 324/421 |
| 2005/0224331 | A1 | 10/2005 | Schmidt et al. | 200/400 |
| 2006/0119344 | A1 * | 6/2006 | Benke et al. | 324/126 |
| 2007/0001677 | A1 * | 1/2007 | Adam et al. | 324/421 |
| 2008/0111542 | A1 | 5/2008 | Takahashi et al. | 324/207.25 |
| 2009/0144019 | A1 | 6/2009 | Elsner et al. | 702/158 |

FOREIGN PATENT DOCUMENTS

| | | |
|---|---|---|
| EP | 0222645 | 5/1987 |

(Continued)

*Primary Examiner* — Michael Friedhofer
(74) *Attorney, Agent, or Firm* — Steptoe & Johnson LLP

(57) ABSTRACT

A device for measuring the wear of the contacts of a switchgear device is described. The switchgear device is of the open circuit breaker type with offset pole-shaft, and the movable contact is mounted on a sliding support. Measurement of the wear of the contacts is based on evaluation of the over-travel of the movable contact in the closed position when the latter slides in its support. This over-travel is determined by measuring the residual rotation of the pole-shaft, preferably by a contact-less magnetic rotation sensor.

16 Claims, 4 Drawing Sheets

FOREIGN PATENT DOCUMENTS

| | | | | |
|---|---|---|---|---|
| EP | 0789380 | | | 8/1997 |
| EP | 0878015 | | | 11/1998 |
| EP | 0977233 | | | 2/2000 |
| EP | 1155909 | | | 11/2001 |
| EP | 1347479 | | | 9/2003 |
| EP | 1830162 | | | 9/2007 |
| EP | 1921423 | | | 5/2008 |
| FR | 2834120 | | | 6/2003 |
| JP | 2000341815 | A | * | 12/2000 |
| WO | 2004/027802 | | | 4/2004 |
| WO | 2004/057634 | | | 7/2004 |
| WO | WO 2004057635 | A1 | * | 7/2004 |
| WO | 2007/033913 | | | 3/2007 |

* cited by examiner

EVALUATION OF THE INTEGRITY OF DEPRESSED CONTACTS BY VARIATION OF THE ROTATION OF THE POLE-SHAFT

CROSS-REFERENCE TO RELATED APPLICATIONS

This application claims the benefit of the priority filing date of French Patent Application No. 0902433, filed May 18, 2009.

TECHNICAL FIELD

The invention relates to evaluation of the erosion of the contacts of pole-units in a switchgear device by indirect measurement of the rotational movement of a driving mechanism of the contacts. In particular, the invention relates to a switchgear device comprising a pair of contacts that are movable with respect to one another, the movable contact being supported by an arm that allows it to perform an over-travel in the closed position. The invention also relates to a method for providing for a high electrodynamic strength switchgear device to be equipped with means enabling the integrity of the contacts to be checked.

STATE OF THE ART

A power line supplying an electric load to be controlled is conventionally provided with at least one switchgear device which, for each phase, comprises pairs of contacts that are movable with respect to one another to switch the load. Actuation of the contacts can be performed in different ways; in particular, for some high-power switching devices (in particular more than 1000 A), used for example as main incoming safety device at the head of the line, a high electrodynamic strength is required and the contacts are driven by a lever system coupled to a rotary pin itself actuated by a toggle mechanism with two pivoting rods, as described for example in EP 0222645, EP 0789380 or EP 1347479.

The contacts can be arranged directly on the conductors or they can comprise pads made from suitable material, in particular made from a silver alloy. Whatever the technological choice, the contacts wear more or less with each switching operation and in particular in the presence of an arc. After a large number of switching operations, this wear can lead to malfunctioning of the switchgear device, with consequences on the safety and availability of the installation. To palliate these risks, a usual solution consists in systematically changing the contacts, or even the whole switchgear device, after a preset number of operations, without any relation to the actual wear of the pads. These operations are however often performed either too late, for example if one of the switching operations has generated a greater electric arc, with the related risks, or too early, with the costs inherent to replacement of pads that show hardly any wear.

The ability to evaluate the integrity of the contacts or to determine their actual wear in order to deduce therefrom information giving the residual lifetime, or the end of life, of pole-unit contacts therefore provides an appreciable advantage. For some high-power devices with a long lifetime, maintenance operations thus regularly provide for a visual evaluation of the state of the contact pads, for example by fitting wear indicators on the contacts. This operation can only be performed by opening the switchgear unit, i.e. when maintenance operations immobilizing the installation are performed. For safety uses in which the switchgear devices are only tripped occasionally and the contacts are usually kept closed, this type of check is often sufficient. However, for other applications that are developing, such as for example as safety device of a wind turbine installation, the number of operations is increasing, and a greater endurance of the contacts is required. Visual checking of the contacts at preset intervals is becoming problematic and insufficient.

Various methods have been developed to evaluate the erosion of the contact pads in regular manner and/or without having to put the switchgear devices out of service. The document EP 0878015 is thus based on modification of the contact pressure during an opening operation of the switchgear device. This type of device does however require the addition of specific means for measuring the switching voltage at a neutral point and the use of an auxiliary switch. The document FR 2834120 proposes studying the modification of the time required to cover the wear travel of the contacts during a closing movement by current measurement in the control electromagnet. This solution does not however apply to circuit breakers able to be opened or closed manually.

The document WO 2007/033913 proposes measuring different parameters characterizing the relative movement of the contacts with respect to that of their actuator, which is of electromagnetic type. It does however appear that this technique is only suitable if the velocity of the contacts, or the force necessary to mobilize them, is variable in time. High-power switchgear devices do however tend to have a linear travel versus time with depression and over-travel of the contacts, which makes this type of method imprecise or even unsuitable.

SUMMARY OF THE INVENTION

Among other advantages, the object of the invention is to provide a device for checking the integrity of the contacts that is simple and suitable for switchgear units having a movable contact that is driven by a rotary shaft and that is depressed at the end of a closing operation of the switchgear device.

According to one feature, the invention relates to an electrical protection device equipped with one such device measuring the variation of rotation of the drive shaft in the over-travel phase. The electrical protection device is preferably multi-pole, and each pole-unit comprises a pair of contacts that are movable with respect to one another between an open position and a closed position. The movable contact is mounted on a support arm comprising two parts that slide with respect to one another so that, in the closed position of the contacts, the movable contact can be either in the rest position, in abutment, or in a depressed position in the support arm. Advantageously, means acting as a spring bias the contact to the non-depressed rest position, protruding from the arm. At least one pair of contacts is preferably associated with a pair of arcing contacts usually separated from one another but closing transiently when the pole-units are actuated. In particular, the movable contact support arm comprises an arcing contact at the end thereof.

The movable contact support arm is driven between the open and closed positions by rotation of a shaft of the protection device that is coupled thereto by a connecting rod system. The rotary shaft is preferably a pole-shaft common to the whole of the switchgear device. The switchgear device can in particular have a high electrodynamic strength, with actuation by a toggle mechanism and resetting device. The residual rotation of the pole-shaft once the contacts are closed, i.e. from the abutment position of the movable contacts to the end of travel corresponding to depression of the movable contact, is preferably about 30% of its total rotation in the course of a closing operation.

According to the invention, the switchgear device comprises a device for determining the wear of the contacts which measures the angle through which the rotary shaft travels between the abutment position of the pole-unit contacts and the end-of-travel position of the shaft. The device for determining is preferably an angular sensor or a rotation sensor coupled directly to the rotary shaft. Advantageously, the rotation sensor is magnetic and operates remotely. In particular, magnetic means, like a magnet, are arranged on the shaft, in particular at the end thereof, and detection means are fitted on the case of the switchgear device facing the magnetic means.

According to another feature, the invention relates to a method enabling a switchgear device as presented to be equipped with a device for measuring the integrity of its contacts by fitting a rotation sensor at one end of the pole-shaft. The method can be applied for existing switchgear devices, and it preferably comprises securing of magnetic means onto one end of the pole-shaft and fitting means for detecting their angular position facing the magnetic means.

BRIEF DESCRIPTION OF THE DRAWINGS

Other advantages and features will become more clearly apparent from the following description of particular embodiments of the invention, given for illustrative and in no way restrictive example purposes, represented in the appended figures.

DETAILED DESCRIPTION OF A PREFERRED EMBODIMENT

Figure 1A:
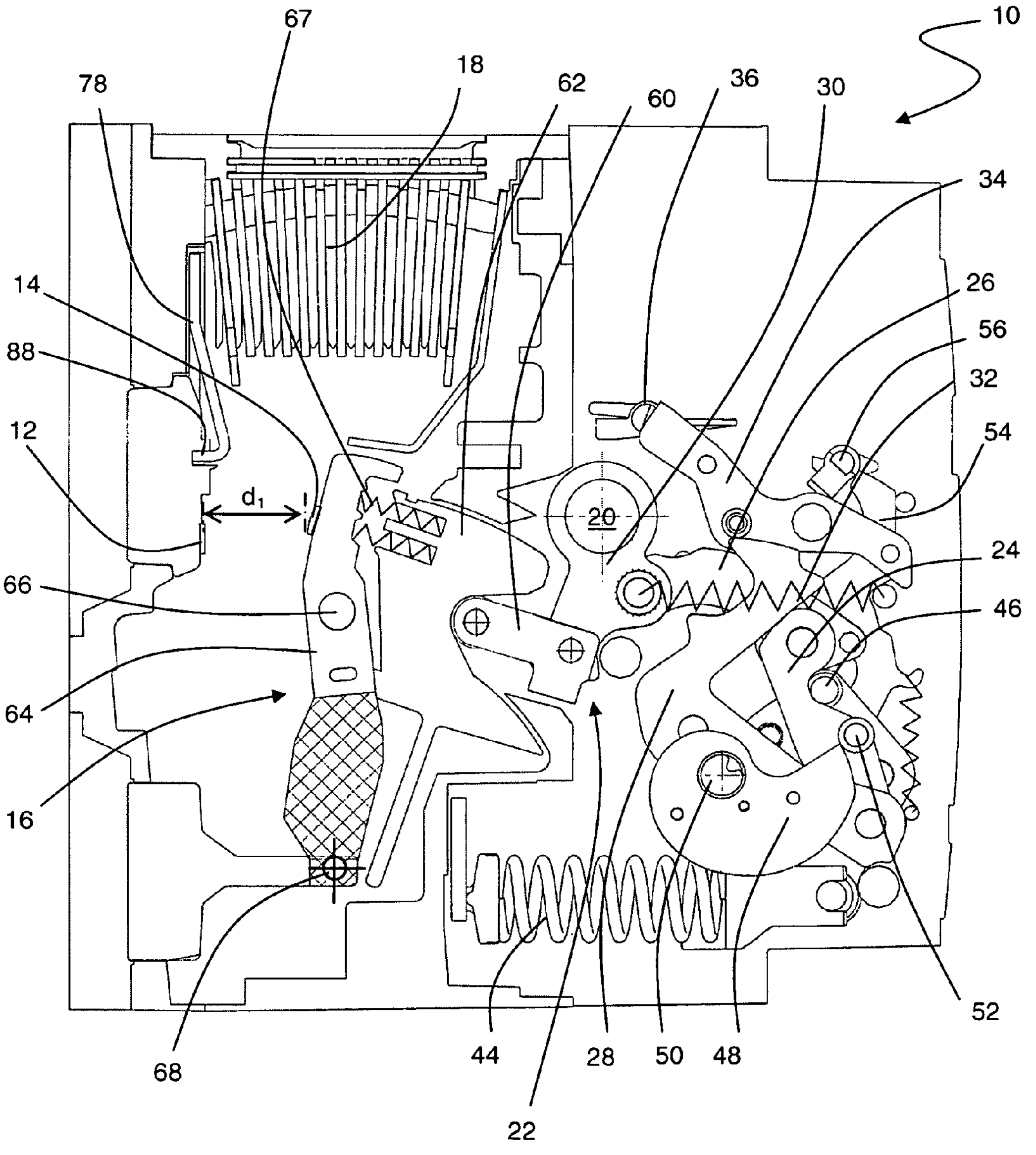
FIG. 1A illustrates a safety switchgear device with high electrodynamic strength wherein a device for determining the wear of the contacts according to the principle of the invention can be implemented.

With reference to FIG. 1A and in conventional manner, a circuit breaker 10 for high currents, in excess of 800 A comprises a pair of breaking contacts, or main contacts, for each pole-unit. Each main contact is preferably associated with a pad 12, 14 made from suitable material, for example from a silver-based alloy, and one of the pads 14 is fitted on an arm 16 pivoting between an open position wherein it is away from the stationary contact 12 and a closed position wherein mechanical and electrical contact between the pads 12, 14 is established. The pole-unit also comprises an arc extinguishing chamber 18 and a pair of main terminals (not shown) designed to plug into connection strips. For these high-rating ranges, the circuit breaker 10 comprises a plurality of pole-units arranged in parallel planes, perpendicular to a pole-shaft 20 that is common thereto. The pole-unit closing or opening order is transmitted to each movable contact 14 from the pole-shaft 20 via a drive mechanism 22 with a lever.

The pole-shaft 20 is mounted rotating on the case of the circuit breaker 10 and is actuated by suitable means. In particular, for open circuit breakers 10 with intermediate pole-shaft 20 and high electrodynamic strength, the actuating mechanism is of toggle type with two rods 24, 26 pivoting with respect to one another. One of the rods 24 is articulated in rotation on a trip hook 28 mounted pivoting on a fixed spindle. The other rod 26 is mechanically coupled to a crank 30 of the pole-shaft 20 which is common to all the pole-units and further forms one of the levers of the drive mechanism 22 of the contacts 14.

An opening spring 32 is anchored between the crank 30 and a fixed securing pin and tends to bias the crank 30 to its open position. An opening ratchet 34, formed by a lever pivoting around a fixed spindle, is controlled by an opening latch 36 in the form of a half-moon. The opening ratchet 34 is biased by a spring towards the trip hook 28, moving away from the half-moon 36. A roller is arranged on the opening ratchet 34 between the ends thereof to operate in conjunction with a V-shaped recess of the trip hook 28, which is biased by a spring (not shown) tending to shorten the distance between the articulation spindle of the toggle mechanism 24, 26 on the trip hook 28 and the articulation spindle of the toggle mechanism on the crank 30.

In a preferred embodiment, the switchgear device 10 is able to be reset, i.e. it is provided with an energy storage device so as to assist the closing function, such as for example described in the document EP 0222645. In particular, a drive lever 40 is mounted pivoting around a fixed spindle 42, and an elastic energy storage device comprising at least a closing spring 44 is mounted pivoting on a fixed point and on a finger of the drive lever 40. The drive lever 40 supports a roller 46 designed to operate in conjunction with a setting cam 48 keyed onto a shaft 50 and comprising a roller 52 designed to operate in conjunction with a closing ratchet 54 pivoting around a fixed spindle. A closing latch 56, designed to latch the ratchet 54, is elastically biased by a spring to its closed position. The ratchet 54 is itself biased by a spring to its latched position.

The pole-shaft 20 is actuated by means of these different components and then drives the movable contacts 14. For this purpose, its crank 30 is provided, for each pole-unit, with a connecting rod system 60 that connects it to the support arm 16 of the movable contact 14. The support arm 16 is provided with two parts that are able to slide with respect to one another. A casing 62 is moved directly by the connecting rod system 60 with respect to which it is pivotally mounted. The part 64 of the arm 16 that supports the contact pad 14 slides inside the casing 62, preferably in articulated manner around a spindle 66. Spring-like means 67, for example one or more contact pressure springs, arranged between the support 64 and casing 62, bias the contact pad 14 to the protruding position with respect to the casing. This configuration allows a closing over-travel of the contact pad 14 with respect to abutment, so that in the position in which current is flowing between the contacts 12, 14, the casing 62 can continue its movement without accentuating the pressure on the contact pads 12, 14. The arm 16 is thus pivotally mounted by its casing 62 around a first spindle 68 between the closed position and the open position, and the support 64 of the movable contact 14 is articulated on a second spindle 66 of the casing 62.

Figure 1B:
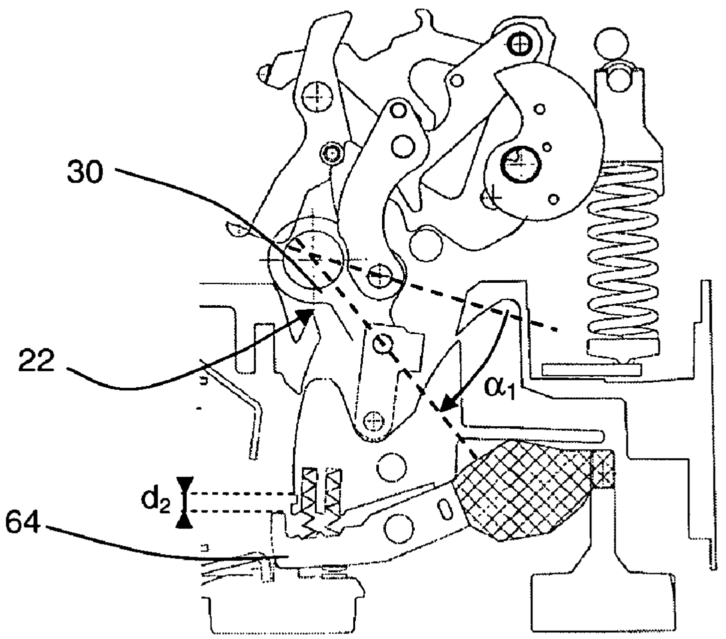
FIGS. 1B and 1C show the closing steps of this switchgear device.
Figure 1C:
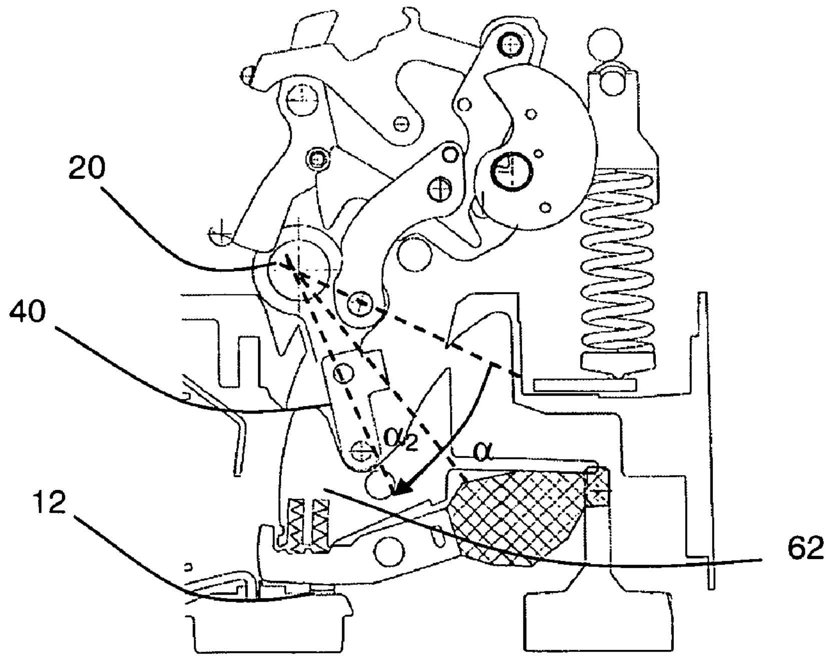

When closing of the contacts 12, 14 takes place, in a first stage the pole-shaft 20 is made to rotate, and the toggle mechanism drives the contact arm 16 directly. When closing is achieved, the two pads 12, 14 come into contact (FIG. 1B). The shaft 20 can then continue its travel and the movement of the casing 62 of the arm 16 continues beyond the abutment position, the movable contact 14 being "depressed" into the casing 62—FIG. 1C. In particular, in the preferred embodiment, the opening distance $d_1$ is about 40 mm, and the depression distance $d_2$ can be about 4.5 to 6 mm, for example 5.5 mm, the travel of the casing 62 thereby being more than 10% greater than the opening distance.

Furthermore, in the illustrated embodiment, the system with toggle 22 and offset pole-shaft 20 enables the movements to be scaled down, and the rotation travel of the pole-shaft 20 continues through a large angle $\alpha_2$ after closing of the pole-units. In particular, the total travel a of the pole-shaft 20, that is fixed and determined by the design of the switchgear device, is about 45 to 50°. At mid-rotation of the shaft 20, the movable contact 14 has already covered ¾ of its travel, and the opening of the contacts is only 10 mm. Thus, when the contacts 12, 14 come into abutment and after a travel $\alpha_1$, the shaft 20 preferably still has about 30% of its rotation to perform.

According to the invention, this remaining travel $\alpha_2$ is used to determine the depression distance $d_2$ of the contact support 64 with precision, i.e. the degree of erosion of the contact pads 12, 14. Indeed, as the wear of the contact pads progresses, the latter come into contact later and the depression distance $d_2$ begins at a higher rotation $\alpha_1$ of the pole-shaft 20. The travel $\alpha_2$ of the pole-shaft 20 after abutment decreases to the same extent, which reduces the depression travel $d_2$ by an amount equal to the variation in the thickness of the contact pads 12, 14, i.e. equal to their wear. The angular variation $(\alpha_2\text{-}\alpha_{2i})$ of the remaining rotation of the shaft 20 after closing is thus directly correlated to the variation $(d_2\text{-}d_{2i})$ of the depression distance of the stationary contact, and therefore to the wear of the contact pads 12, 14.

According to the invention, a sensor 70 measures the rotation $\alpha_2$ of the pole-shaft 20 between the moment when abutment between the movable and stationary contacts 12, 14 takes place, i.e. the beginning of current flow in the switchgear device 10, and the end of travel of the shaft 20 in the closed position. The travel $\alpha$ of the shaft 20 is in fact constant (about fifty degrees or so—for example $\alpha=52°$) and the depression distance $d_{2i}$ of the contacts is fixed at the beginning of life of the switchgear device 10 (for example $d_{2i}=5.5$ mm). A simple measurement, either in plant or when the first determination is made, by definition without any wear of the contacts, gives the value of the two steps of travel of the shaft. For example $\alpha_{1i}=32°$ and $\alpha_{2i}=20°$. A direct relation enables the distance $d_2$ or the wear $(d_2\text{-}d_{2i})$ to be evaluated, in the course of time, according to the variation $(\alpha_2\text{-}\alpha_{2i})$, for example by a percentage.

It should be noted that, in the preferred embodiment, due to scaling-down and the large variation of the angular position $\alpha_2$ of the pole-shaft 20 corresponding to the small variation of the depression travel $d_2$, typical of open circuit breakers 10, the wear of the contacts can be determined precisely, a determination that can be correlated to a remaining lifetime of the product (see for example WO 2004/057634). In particular, a lifetime can be estimated by comparing the wear $(d_2\text{-}d_{2i})$ with a minimum authorized over-travel before changing the contact pads 12, 14.

The sensor 70, of small volume, is preferably located at the end of the shaft 20, for example at an end close to the case of the circuit breaker 10, outside the areas liable to be polluted by debris when current interruption takes place and away from possible projections of hot gases.

Figure 2:
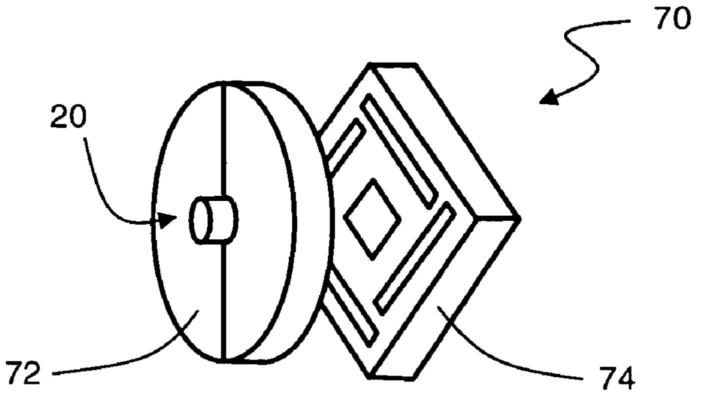
FIG. 2 represents a sensor used in a preferred embodiment of the invention.

Switchgear devices 10 with high electrodynamic strength have a lifetime that can span up to thirty years. The sensor 70 is advantageously of the contact-less type in order to limit any biasing due to wear or friction within the sensor 70. In particular, a sensor of magnetic type without sliding contact, in particular a magnetic array type rotation sensor, is suitable on account of its absence of parts liable to wear quickly. As illustrated in FIG. 2, this type of sensor 70 comprises magnetic means 72, in particular a magnet, that can be secured to the element whose rotation is to be determined. In particular, the magnet 72 can be directly coupled to the pole-shaft 20 at the end thereof by bonding, or any other mechanical means. The sensor 70 further comprises detection means 74, and in particular a detector of card or printed circuit type with sides measuring about 4 mm. The detector 74 is positioned facing the magnetic means 72, for example coupled to the case of the circuit breaker 10, in particular fitted in a suitable housing. The detector 74 is connected in conventional manner to data processing and result presentation means, for example an electronic module already present on the circuit breaker 10 to which a new function is added.

Advantageously, the sensor 70 is as described in the documents EP 1830162 or EP 1921423, with an angular resolution of about 0.2° to 0.5°. In particular, an angular resolution of about 0.36° is equivalent to less than a thousandth of a revolution. In the previous embodiment, this corresponds to a resolution in depression of less than 0.1 mm. As the contact pads 12, 14 are conventionally manufactured so as to tolerate wear of 2.5 to 3 mm, monitoring of the lifetime by this method is reliable.

The sensor 70 can be fitted in place on any new switchgear device 10. Fitting of the sensor 70 is preferably optional so as to avoid the additional cost of detection for switchgear devices 10 designed for a pure safety use in which visual determination of the wear of the contacts 12, 14 in the course of maintenance operations may prove sufficient. It is also possible to fit this device for measuring the wear of the contacts by angular variation on existing switchgear devices 10 by positioning the two respective parts of the sensor 70, for example by fixing a magnet 72 on the pole-shaft 20 that is easily accessible when the cover of the circuit breaker 10 is open, and fixing the detector 74 onto the case by any suitable means, of bonding or other type.

In particular, the device and method according to the invention are also suitable for the former switchgear devices 10 which comprises in addition an arcing contact. In this configuration, the arcing contact is the component that is mainly affected by the wear phenomenon. On account of the precision of determination according to the invention, it is possible to check and monitor the integrity of the contact pads 12, 14 so as for example to generate an alarm in the event of an acceptable degree of wear being exceeded.

In particular, the arc extinguishing chamber 18 of the high-current switchgear device 10 is limited by an arc guiding horn 78—see FIG. 1A. As also presented in the document EP 0410902, to improve the electric withstand of the switchgear device 10, a pair of arcing contacts 82, 84 are added, in proximity to an edge 88 of said horn 78. According to a preferred embodiment illustrated in FIG. 3, a stationary arcing contact 82 is adjacent to one of the main stationary contacts 12, and the movable arcing contact 84 is located on the same arm 16 as the movable main contact 14, in particular at one end of the same support 64 sliding in the casing 62. Depending on the rating of the switchgear device 10, a single pair or several pairs of arcing contacts 82, 84 are present, for example six arms 16 out of ten present movable arcing contacts 84.

Figure 3A:
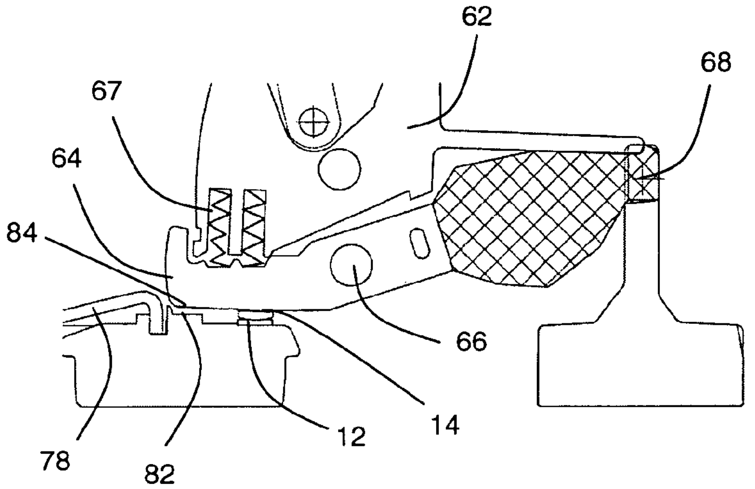
FIGS. 3A to 3C show the opening steps of a switchgear device according to an embodiment of the invention.
Figure 3B:
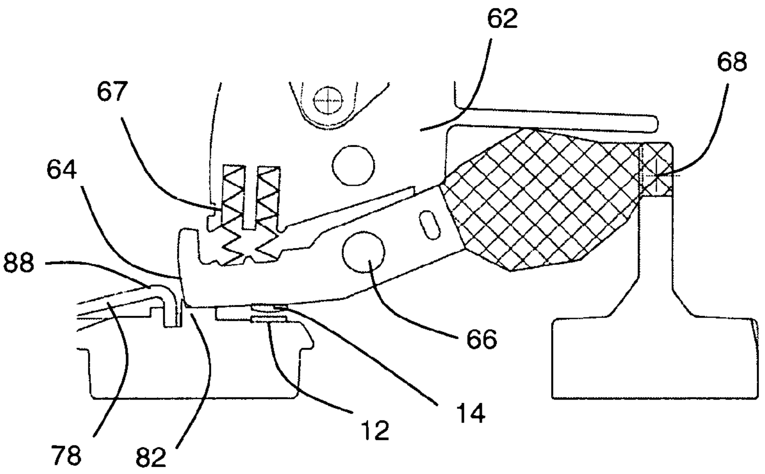
Figure 3C:
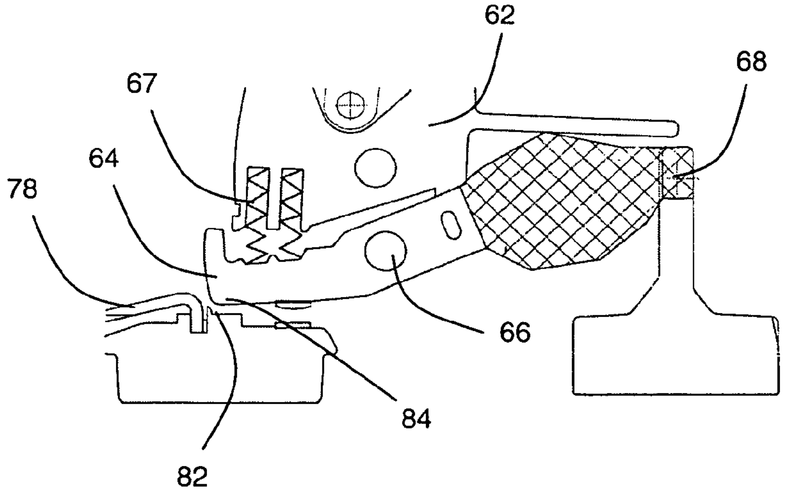

As illustrated in FIGS. 3A to 3C, the pair of arcing contacts 82, 84 are usually open, i.e. the two arcing contacts are separated from one another. When tripping of the switchgear device 10 occurs, temporary closing of the arcing contacts 82, 84 takes place before the main contacts 12, 14 separate, so that when separation of the main contacts 12, 14 takes place, there is no interruption of the current that flows via the arcing contacts. When movement of the pole-shaft 20 is continued, the arcing contacts 82, 84 open to interrupt the current with formation of an electric arc guided by the edge 88 and the guiding horn 78. As the arc is mainly located on the arcing contacts 82, 84, the material of the latter is chosen to enhance their resistance, the main contacts 12, 14 remaining made from the material that is the most suitable for normal flow of the rated high-intensity current.

Figure 4:
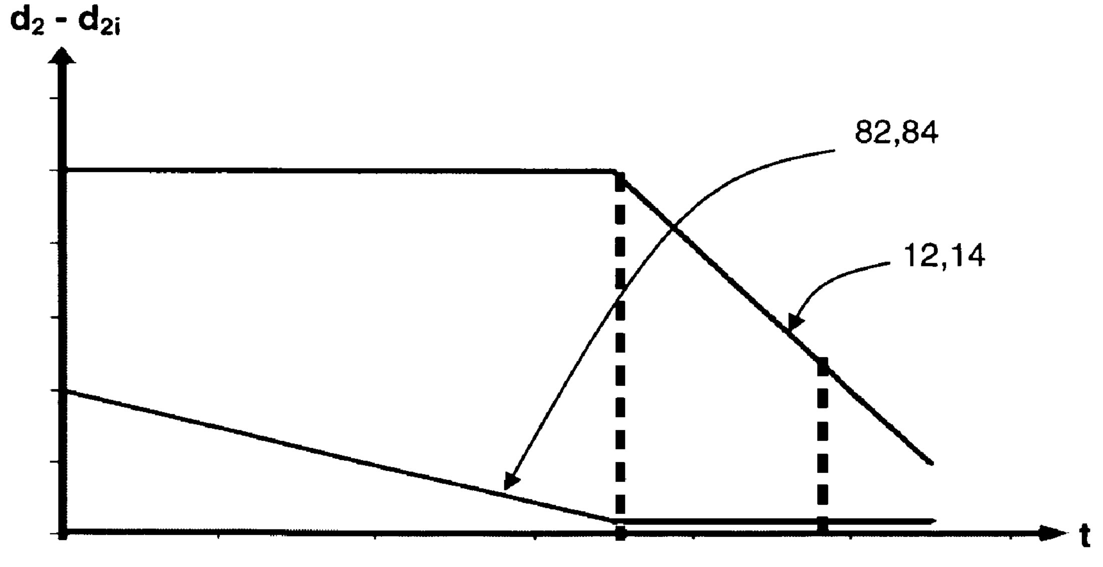
FIG. 4 shows a schematized plot of the wear curve of the contacts in the presence of arcing contacts.

In this embodiment, as schematized in FIG. 4, in a first stage, only the arcing contacts 82, 84 wear, the main contacts 12, 14 substantially preserving their integrity. Once the arcing contacts 82, 84 are worn, fleeting closing no longer takes place and the arc starts to damage the stationary contacts 12, 14. The method for determining wear according to the invention here enables the erosion of the contacts to be monitored by measuring the angle of rotation of the rotary shaft 20, so that replacement thereof can be scheduled as soon as their integrity curve drops off.

The angle is in fact measured after abutment of the arcing contacts 82, 84, and in a first stage it is the erosion of said arcing contacts 82, 84 that is monitored. The wear of the contact pads 12, 14 is considered in a second stage and an alarm is generated either as soon as the contact pads 12, 14 start to wear or in the event of an acceptable degree of wear of the main contacts 12, 14 being exceeded. This embodiment enables predictive action to be taken by means of visualization of the erosion of the arcing contacts 82, 84, whereas a conventional depression measurement system does not enable the beginning of wear of the main contacts 12, 14 to be monitored and therefore anticipated.

Although the invention has been described with reference to contacts 12, 14 of a switchgear device 10 with high electrodynamic strength in which the opening mechanism implies a large variation of the angular position of the pole-shaft 20 for a small variation of the depression over-travel, it is not limited thereto. Other types of switchgear devices, contactors and/or circuit breakers can be concerned. Although scaling-down of the movements by a double rod and toggle joint amplifies the angular difference depending on whether the contacts are worn or not, according to the travel of the contacts and according to the precision of the detection device 70, it is possible to apply the device according to the invention to other actuating mechanisms comprising a rotary part.

The invention claimed is:

1. An electrical protection switchgear device comprising at least one pole-unit wherein each pole-unit comprises: a pair of main contacts that are movable with respect to one another between an open position and a closed position; a support arm of a first main contact comprising a first part supporting the first main contact and a second part, the two parts sliding with respect to one another so that, in the closed position of the pair of main contacts, the second part can take a first abutment position and a second end-of-travel position in which the first part is depressed into the second part; a drive mechanism of the support arm comprising a rotary shaft and at least one connecting rod system which couples the latter pivotally to the second part of the support arm; and wherein the electrical protection switchgear device comprises a device for determining the integrity of the main contacts, said device being suitable for measuring the angle of rotation of the rotary shaft between the first abutment position and the second end-of-travel position.

2. Electrical protection switchgear device according to claim 1 wherein the support arm further comprises means biasing the first part to a protruding position with respect to the second part.

3. Electrical protection switchgear device according to claim 1 wherein the electrical protection device comprises a plurality of identical pole-units and a pole-shaft common to all the pole-units, the pole-shaft being the rotary shaft of the drive mechanisms.

4. Electrical protection switchgear device according to claim 3 further comprising a pair of arcing contacts that are movable with respect to one another between an open position and a closed position, a first movable arcing contact being securedly attached to a support arm, the pair of arcing contacts being in the open position in the closed position of the main contacts and in the second end-of-travel position of the main contacts, and taking the closed position between the two.

5. Electrical protection switchgear device according to claim 3 further comprising an actuating mechanism of the pole-shaft with two rods, and a resetting device.

6. Electrical protection switchgear device according to claim 5 wherein the rotation of the pole-shaft between the first abutment position and the second end-of-travel position is about 30% of the rotation of the pole-shaft between the open position of the main contacts and the second end-of-travel position.

7. Electrical protection switchgear device according to claim 1 wherein the device for determining comprises a rotation sensor one component whereof is arranged on the rotation shaft.

8. Electrical protection switchgear device according to claim 7 wherein the rotation sensor comprises magnetic means arranged on the rotation shaft and detection means fitted on the case of the electrical protection switchgear device, the magnetic means and detection means communicating without contact.

9. An electrical protection switchgear device comprising a plurality of identical pole-units and a rotary pole-shaft common to all the pole-units, wherein each pole-unit comprises a pair of main contacts that are movable with respect to one another between an open position and a closed position; a support arm of a first main contact comprising a first part supporting the first main contact and a second part, the two parts sliding with respect to one another so that, in the closed position of the pair of main contacts, the second part can take a first abutment position and a second end-of-travel position in which the first part is depressed into the second part; and a drive mechanism of the support arm comprising at least one connecting rod system which couples the pole-shaft pivotally to the second part of the support arm; and wherein the electrical protection switchgear device comprises a device for determining the integrity of the main contacts, said device being suitable for measuring the angle of rotation of the rotary pole-shaft between the first abutment position and the second end-of-travel position.

10. Electrical protection switchgear device according to claim 9 wherein the rotation of the pole-shaft between the first abutment position and the second end-of-travel position is about 30% of the rotation of the pole-shaft between the open position of the main contacts and the second end-of-travel position.

11. Electrical protection switchgear device according to claim 10 further comprising a pair of arcing contacts that are movable with respect to one another between an open position and a closed position, a first movable arcing contact being securedly attached to a support arm, the pair of arcing contacts being in the open position in the closed position of the main contacts and in the second end-of-travel position of the main contacts, and taking the closed position between the two.

12. Electrical protection switchgear device according to claim 10 wherein the device for determining comprises a rotation sensor one component whereof is arranged on the rotation shaft.

13. Electrical protection switchgear device according to claim 9 further comprising an actuating mechanism of the pole-shaft with two rods.

14. Electrical protection switchgear device according to claim 9 wherein the device for determining comprises magnetic means arranged on the rotation shaft and detection means fitted on the case of the electrical protection switchgear device, the magnetic means and detection means communicating without contact.

15. A method for manufacturing an electrical protection switchgear device equipped with a device for measuring the erosion of its contacts, wherein the electrical protection switchgear device comprises a rotary pole-shaft driving at least one movable contact between an open position and a closed position of a pair of contacts, said movable contact being mounted movable on its support so that in the closed position of the contacts, the movable contact can take an abutment position and a depressed position in its support, said method for manufacturing comprising fitting of a rotation sensor of the pole-shaft at the level of one end of said pole-shaft.

16. Method according to claim 15 wherein fitting of a sensor comprises securing magnetic means onto one end of the pole-shaft and fitting detection means of their angular position facing the magnetic means.

* * * * *